United States Patent [19]

Luther, Jr. et al.

[11] 4,122,415
[45] Oct. 24, 1978

[54] AM TRANSMITTER WITH AN OFFSET VOLTAGE TO THE RF STAGE TO COMPENSATE FOR SWITCHING TIME OF THE MODULATORS

[75] Inventors: Arch Clinton Luther, Jr., Woodstown, N.J.; David Arthur Sauer, McMurray, Pa.

[73] Assignee: RCA Corporation, New York, N.Y.

[21] Appl. No.: 859,189

[22] Filed: Dec. 9, 1977

[30] Foreign Application Priority Data

Mar. 21, 1977 [GB] United Kingdom ............... 11901/77

[51] Int. Cl.² .............................................. H03C 1/02
[52] U.S. Cl. .................................. 332/37 R; 325/144; 325/182; 332/41
[58] Field of Search ............... 332/9 R, 9 T, 10, 31 R, 332/31 T, 37 R, 41; 325/139, 142, 144, 182

[56] References Cited

U.S. PATENT DOCUMENTS

| | | | |
|---|---|---|---|
| 1,655,543 | 1/1928 | Heising | 332/15 |
| 3,413,570 | 11/1968 | Bruene et al. | 332/9 T |
| 3,506,920 | 4/1970 | Swanson | 325/142 |
| 3,943,446 | 3/1976 | Quidort | 325/144 |
| 4,063,199 | 12/1977 | Oursler, Jr. | 332/41 |

*Primary Examiner*—Siegfried H. Grimm
*Attorney, Agent, or Firm*—Eugene M. Whitacre; Paul J. Rasmussen; Robert L. Troike

[57] ABSTRACT

An AM transmitter of the type including apparatus for generating a subcarrier signal, pulse width modulating this subcarrier with audio, amplifying this resulting pulse width signal using active devices operating in the more efficient switching mode is disclosed. The amplified pulse width signal is passed through a low pass filter wherein the audio is recovered and used to amplitude modulate a radio frequency stage. The improvement herein includes a means for providing an offset voltage to the RF stage so that the system will develop zero carrier output when the pulse width of the modulating signal to the active devices has a relatively small finite value.

7 Claims, 1 Drawing Figure

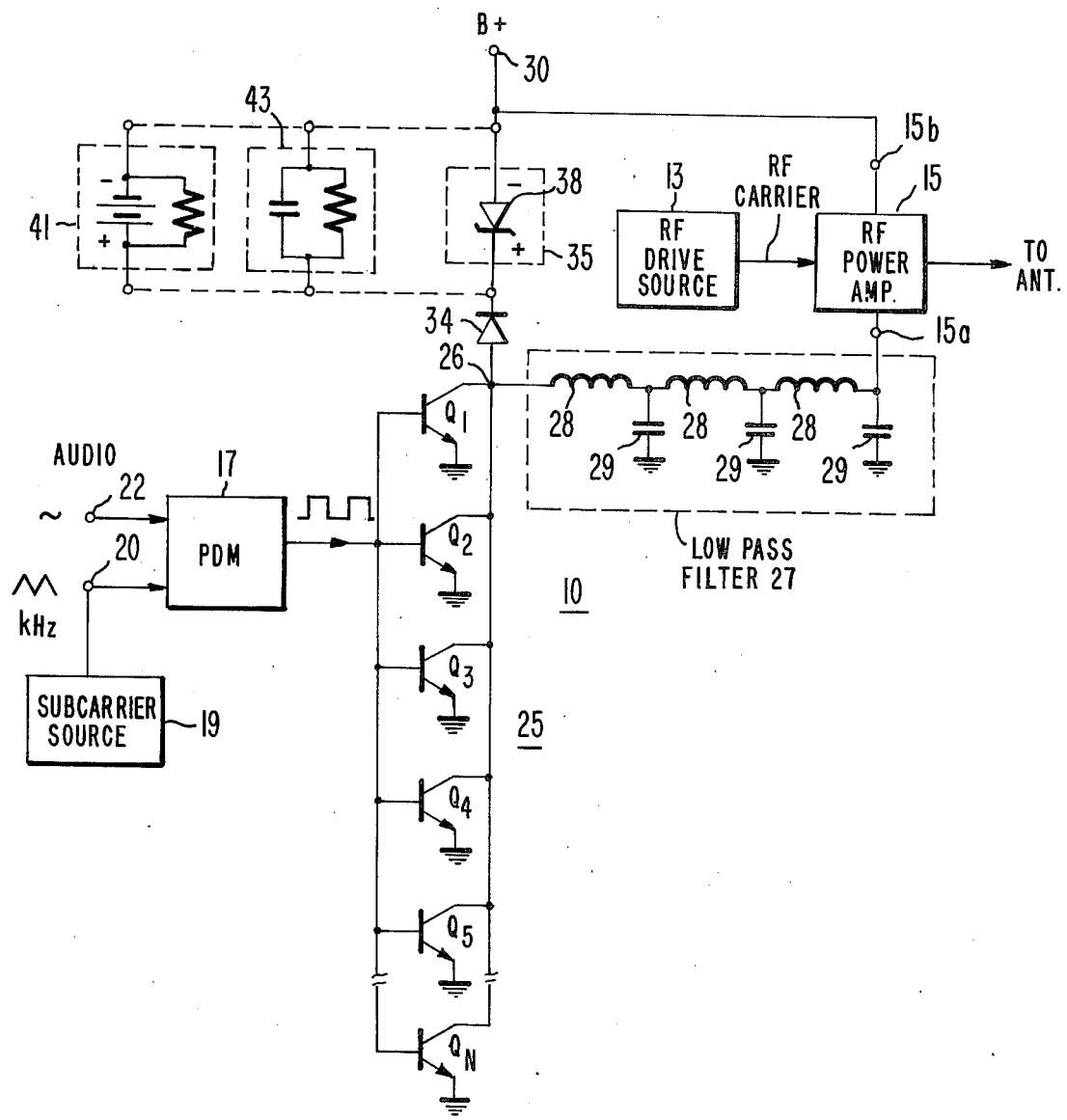

AM TRANSMITTER WITH AN OFFSET VOLTAGE TO THE RF STAGE TO COMPENSATE FOR SWITCHING TIME OF THE MODULATORS

BACKGROUND OF THE INVENTION

This invention relates to amplitude modulation transmitters and, more particularly, to the high efficiency type of AM transmitters for broadcasting using pulse width or pulse duration modulation. This type of amplitude modulation is described for example in Heising U.S. Pat. No. 1,655,543; Swanson U.S. Pat. No. 3,506,920 and Quidort U.S. Pat. No. 3,943,446.

In such transmitters the audio and subcarrier signals are applied to a pulse width or pulse duration modulator. The resulting pulse width modulated subcarrier signals are applied to amplifiers which increase the power necessary to modulate a high powered carrier signal. Since the efficiency of an amplifier device is maximized at points of maximum current or minimum current, the pulse width modulated subcarrier operates the amplifier in the efficient "on" and "off" states. The subcarrier is then removed via a low pass filter and the DC varying at the audio rate is applied to the RF stage without an expensive transformer to modulate the carrier.

There is a problem with distortion when modulating all the way to zero carrier amplitude (100% negative modulation). This is because such a condition requires that the pulse width in the modulator go to zero. As zero width is approached, the finite switching time of the modulator transistor becomes significant and interferes with the linearity of the system. Distortion associated with narrow width pulses using tubes as the modulators is compensated in Swanson U.S. Pat. No. 2,506,920 and 3,588,744 by amplitude modulating the pulse train.

SUMMARY OF THE INVENTION

An improved AM transmitter of the type including a pulse width modulator is provided. The pulse width modulator in response to a subcarrier waveform and an audio waveform provides pulse width modulated rectangular waves. The pulse width modulated waves are amplified by devices operating in a switching mode and the amplified width modulated waves are applied to a low pass filter where the subcarrier is removed and varying DC is applied to one terminal of an RF stage, the opposite terminal of which is coupled to a potential source. The amplifier devices are likewise coupled to the potential source. A diode is coupled between the amplifier devices and the potential source for coupling energy in the low pass filter when the amplifying devices are in the nonconducting off state. A voltage is provided at the diode so that the RF stage is cut off before the pulse width to the amplifying means reaches zero value.

BRIEF DESCRIPTION OF THE DRAWING

The sole FIGURE is a diagram of a radio transmitter controlled in accordance with the subject invention.

DESCRIPTION OF THE INVENTION

Referring, more particularly to the FIGURE, there is illustrated the radio transmitter 10 including an RF generator or drive source 13 which is adapted to provide a carrier signal of predetermined RF frequency. The RF drive source 13 may include one or more drive amplifiers for increasing the power output to the RF power amplifier. The output of the driver source 13 is applied to the RF power amplifier 15, the output of which is fed to a radiating antenna, not shown. The RF power amplifer 15 is modulated by reconstructed audio from a pulse duration modulator 17. A subcarrier waveform from a subcarrier source 19 is coupled to terminal 20 of pulse duration modulator 17. This subcarrier signal may be for example a triangular waveform as illustrated in U.S. Pat. No. 3,943,446 of Quidort. The audio input is applied to terminal 22. The pulse duration modulator 17 may be a comparator and is described in connection with the U.S. Pat. No. 3,943,446 to produce varying pulse width rectangular waveform. The resultant pulse duration modulated rectangular waveform at the output of modulator 17 is fed to a modulation switch 25. The pulse duration modulator 17 may include a plurality of amplifiers to raise the potential level of the pulse duration modulated signal applied to the modulation switch 25. The modulation switch 25 includes a plurality of parallel connected transistors $Q_1$ thru $Q_N$ having the emitters of each coupled to ground or reference potential, the bases coupled to each other and to the output of the pulse duration modulator 17 and the collectors connected via a common point 26 to a low pass filter 27. The low pass filter 27 is connected to one side of the RF power amplifier 15 as shown by terminal 15a. The other side of the RF power amplifier 15 is coupled via terminal 15b to the B+ supply potential applied at terminal 30. It can be seen that the RF power amplifier 15 is returned to ground through the filter 27 and the modulation switch 25. The low pass filter 27 includes series connected coils 28 between modulation switch 25 and terminal 15a of amplifier 15. The filter 27 also includes bypass capacitors 29 to bypass the subcarrier frequency signal to ground or reference potential. Since the pulse duration modulated rectangular wave appearing at the output of modulator 17 includes sidebands containing the square wave subcarrier as well as audio frequency, the filter 27 removes the subcarrier frequency signals leaving a recovered audio modulating signal or a DC level varying at the audio rate at terminal 15a. The RF carrier level provided by the RF generator 13 modulated at power amplifier 15 and applied to the antenna for radiation is determined by the DC level appearing at terminal 15a.

The collectors of the parallel connected transistors $Q_1$ thru $Q_N$ which make up the modulation switch 25 are coupled via a diode 34 and an offset source 35 of DC voltage to B+ supply terminal 30. In the example illustrated in the FIGURE, this source of supply voltage is provided by a zener diode 38 with the cathodes of the zener diode 38 and the diode 34 connected to each other and the anode of the zener diode 38 connected to the supply at terminal 30 and the anode of diode 34 coupled to the junction point 26 of collectors of the modulation switch 25 and low pass filter 27. When the transistors $Q_1$ thru $Q_N$ are switched "on" (maximum current) by the rectangular pulses, the collector voltages are nearly at ground or reference potential. The diode 34 is therefore reverse biased and the voltage at terminal 15a is low. When the transistors $Q_1$ thru $Q_N$ are switched "off" (minimum current) by the rectangular pulses, the residual flux in the coils 28 of the low pass filter 27 produces a reversing current to flow through the diode 34. As the audio level increases in magnitude at terminal 22 of the pulse duration modulator 17, the pulse width and therefore the "on" time of the transistors, $Q_1$ thru $Q_N$ of the modulator switch 20 increases. This causes a decrease in the average value of the voltage at terminal 15a, causing an increased power at the output of the power amplifier 15. As the audio level becomes more negative, the pulse width becomes shorter from the output of the pulse duration modulator 17 and hence the average voltage at terminal 15a becomes more positive which reduces the output from the power amplifier 15.

A difficulty occurs with such a pulse width controlled modulator when the negative level of the audio tends to modulate the carrier all the way to zero amplitude (100% negative modulation). This is because such a condition requires that the pulse width from the modulator 17 go to zero. As zero width is approached, the finite switching time of the modulator transistors $Q_1$ thru $Q_N$ becomes significant and interferes with the linearity of the system.

This problem is overcome in the arrangement of the FIGURE by providing fixed offset voltage $V_1$ by element 35 so that a voltage more positive than the voltage at terminal 30 is maintained at the cathode of diode 34. By this back biasing voltage, the system will develop zero volts and therefore zero carrier output when the pulse width to the modulator transistors $Q_1$ thru $Q_N$ still has a finite value. This distortion of the narrow pulse operation is thereby eliminated.

In the arrangement of the FIGURE, the element 35 to provide this offset voltage is zener diode 38. As the audio becomes more and more negative and consequently the transistors $Q_1$ thru $Q_N$ are turned "off" over a greater portion of the duty cycle, the reverse current flow through the diode 34 causes a voltage at the cathode of diode 34 which is more positive than the voltage at terminal 30. This voltage at the cathode of diode 34 that is more positive than the supply voltage ($V_{cc}$) at terminal 30 produces an average voltage level at terminal 15a that cuts off the RF power amplifier before the finite width of the pulse becomes zero. The point at which power output reaches zero depends upon when the average voltage obtained from the "on" duty cycles of the transistors $Q_1$ thru $Q_N$ is at or below the offset voltage provided by the zener diode.

The offset voltage may also be provided by a storage battery alone or a power supply indicated by the battery and a parallel resistor as illustrated in dashed lines 41 or by resistor-capacitor network as indicated by network 43 in dashed lines. The reversing current through the bypassed resistor in network 43 establishes the offset voltage. However, since the offset voltage should be a constant throughout the modulation cycle, it is more practical to use electronic regulation (zener diode for example) than to provide bypasses for the audio modulation frequencies. For a system as described above with 230 volts at terminal 30, a 10 volt zener was sufficient offset.

What is claimed is:

1. In an AM transmitter of the type including a pulse width modulator responsive to a local subcarrier and intelligence signals for producing pulse width modulated rectangular waves with the width of the waves dependent on the amplitude of the intelligence signals, amplifying means including active devices switched "on" and "off" in accordance with the width of said waves, an RF carrier stage, a source of biasing potential coupled to said RF carrier stage and said amplifying means, a low pass filter including series connected coils coupled between said amplifying means and said RF carrier stage for removing the subcarrier and applying high level DC varying at the audio rate to said carrier stage for modulating same, the improvement therewith for preventing distortion when the pulse width approaches zero width and the finite switch time of the amplifying means becomes significant comprising:
   coupling means coupled between the amplifying means and said source of potential for coupling energy in the series connected coils of the filter when the amplifying means is in the "off" state, and
   means coupled between said coupling means and said source of potential for providing a back biasing voltage to said RF carrier stage so that the carrier output goes to zero as the pulse width reaches a relatively small finite value.

2. In an AM transmitter of the type including a pulse width modulator responsive to a local subcarrier and intelligence signals for producing pulse width modulated rectangular waves with the width of the waves dependent on the amplitude of the intelligence signals, amplifying means including active devices switched "on" and "off" in accordance with the width of said waves, an RF carrier stage, a source of biasing potential coupled to said RF carrier stage and said amplifying means, a low pass filter including series connected coils coupled between said amplifying means and said RF carrier stage for removing the subcarrier and applying high level DC varying at the audio rate to said carrier stage for modulating same, the improvement therewith for preventing distortion when the pulse width approaches zero width and the finite switch time of the amplifying means becomes significant comprising:
   a diode coupled between the amplifying means and said source of potential for coupling energy in the series connected coils of the low pass filter when the amplifying means in the "off" state, and
   means coupled between said diode and said source of potential for providing a back biasing voltage to said diode so that a voltage more positive than the potential source is provided at the cathode of the diode so that the system will develop zero volts across the RF carrier stage and no carrier output as the pulse width of the signal to the amplifying means reaches a relatively small finite value.

3. The combination of claim 2 wherein said means for providing a back biasing voltage includes a zener diode.

4. The combination of claim 2 wherein said means for providing a back biasing voltage includes a resistor and a bypass capacitor.

5. The combination of claim 2 wherein said means for providing a back biasing voltage includes a power supply.

6. The combination of claim 5 wherein said power supply is a battery.

7. The combination of claim 5 wherein said back biasing voltage includes a resistor coupled across said power supply.

* * * * *

UNITED STATES PATENT OFFICE
CERTIFICATE OF CORRECTION

PATENT NO. : 4,122,415

DATED : October 24, 1978

INVENTOR(S) : ARCH CLINTON LUTHER, JR., et al

It is certified that error appears in the above-identified patent and that said Letters Patent are hereby corrected as shown below:

Column 1, line 36, that portion reading "2,506,920" should read -- 3,506,920.

Signed and Sealed this

Twenty-third Day of January 1979

[SEAL]

Attest:

RUTH C. MASON
Attesting Officer

DONALD W. BANNER
Commissioner of Patents and Trademarks